United States Patent
Canegallo et al.

(10) Patent No.: US 9,432,020 B2
(45) Date of Patent: Aug. 30, 2016

(54) COMMUNICATION CELL FOR AN INTEGRATED CIRCUIT OPERATING IN CONTACT AND CONTACTLESS MODE, ELECTRONIC CHIP COMPRISING THE COMMUNICATION CELL, ELECTRONIC SYSTEM INCLUDING THE CHIP, AND TEST APPARATUS

(71) Applicant: STMicroelectronics S.r.l., Agrate Brianza (IT)

(72) Inventors: Roberto Canegallo, Rimini (IT); Luca Perilli, Teramo (IT); Luca Perugini, Bologna (IT); Salvatore Valerio Cani, Agrigento (IT); Eleonora Franchi, Bologna (IT)

(73) Assignee: STMICROELECTRONICS S.R.L., Agrate, Brianza (IT)

( * ) Notice: Subject to any disclaimer, the term of this patent is extended or adjusted under 35 U.S.C. 154(b) by 0 days.

(21) Appl. No.: 14/744,288

(22) Filed: Jun. 19, 2015

(65) Prior Publication Data

US 2015/0381177 A1    Dec. 31, 2015

(30) Foreign Application Priority Data

Jun. 25, 2014 (IT) .............. TO2014A0503

(51) Int. Cl.
*H03K 19/173* (2006.01)
*H03K 19/0175* (2006.01)
*H03K 19/0948* (2006.01)
*G01R 31/28* (2006.01)
*H03K 19/0185* (2006.01)

(52) U.S. Cl.
CPC ....... *H03K 19/0175* (2013.01); *G01R 31/2886* (2013.01); *H03K 19/0185* (2013.01); *H03K 19/0948* (2013.01)

(58) Field of Classification Search
CPC .................................................. H04L 25/0272
USPC .......................................................... 326/82
See application file for complete search history.

(56) References Cited

U.S. PATENT DOCUMENTS 5,642,364 A    6/1997  Farwell
6,968,488 B2  11/2005  Barbera et al.
(Continued)

FOREIGN PATENT DOCUMENTS

EP    2341626 A2    7/2011

OTHER PUBLICATIONS

IT Search Report and Written Opinion for IT TO2014A000503 dated Nov. 4, 2014 (9 pages).

*Primary Examiner* — Don Le
(74) *Attorney, Agent, or Firm* — Gardere Wynne Sewell LLP

(57) ABSTRACT

A communication cell for an integrated circuit includes a physical interface configured to supply an input signal (for example, a capacitive signal or an ohmic signal). A receiver circuit operates to receive the capacitive signal and generate a first intermediate signal. A buffer circuit operates to receive the ohmic signal and generate a second intermediate signal. An output stage including a selector device (for example, a multiplexer) configured to receive the first and second intermediate signals and selectively pass only one of those signals to the integrated circuit based on operating condition. The input signal may further be an inductive signal, with the output stage further functioning to selectively pass that signal based on operating condition.

26 Claims, 9 Drawing Sheets

(56) References Cited

U.S. PATENT DOCUMENTS 7,928,750 B2 4/2011 Miller
2003/0167430 A1 9/2003 Barbera et al.
2007/0030116 A1* 2/2007 Feher .................... H04M 3/382
                                                           340/5.53
2009/0102494 A1 4/2009 Miller
2011/0171906 A1 7/2011 Canegallo et al.
2014/0091835 A1 4/2014 Nelson

* cited by examiner

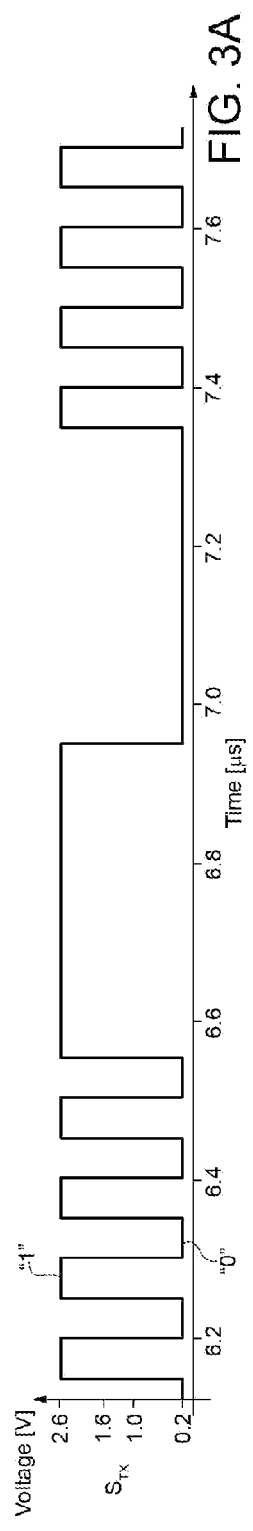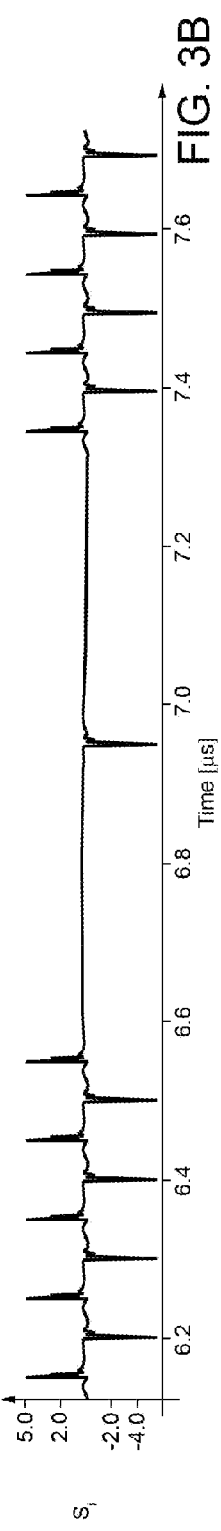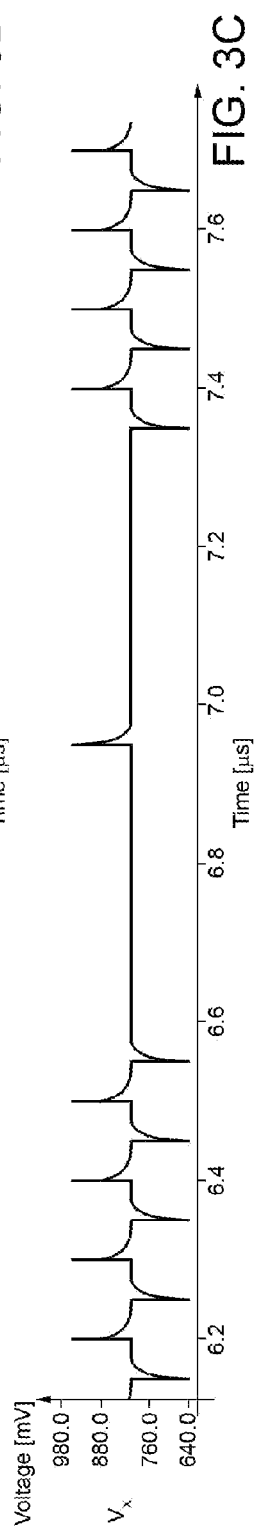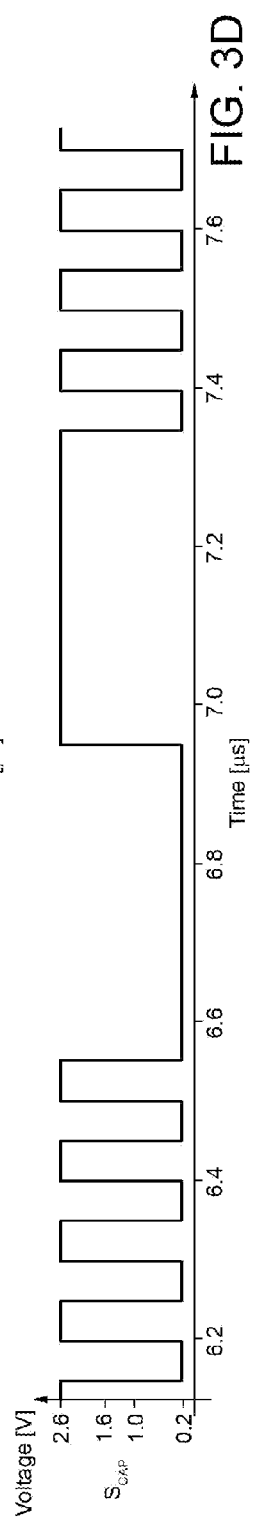

COMMUNICATION CELL FOR AN INTEGRATED CIRCUIT OPERATING IN CONTACT AND CONTACTLESS MODE, ELECTRONIC CHIP COMPRISING THE COMMUNICATION CELL, ELECTRONIC SYSTEM INCLUDING THE CHIP, AND TEST APPARATUS

PRIORITY CLAIM

This application claims priority from Italian Application for Patent No. TO2014A000503 filed Jun. 25 2014, the disclosure of which is incorporated by reference.

TECHNICAL FIELD

The present invention relates to a communication cell for an integrated circuit, to an electronic chip comprising said communication cell, to an electronic system including said chip, and to a test apparatus.

BACKGROUND

As is known, an integrated device or a generic electronic circuit in general comprises a plurality of input/output communication cells, which have the function of communication-interface means and are provided in the form of metal pads connected to a corresponding circuit configured to enable a bidirectional communication or, alternatively, a communication just for receiving data (input mode) or just for sending data (output mode) by/from the integrated device from/to the outside world. In the sequel of the description the term "communication cell" refers to the metal pad and to the communication circuit, whether unidirectional (input or output) or bidirectional (input and output), coupled to said metal pad.

Communication cells of a known type may be used, for example, for connecting components of a generic electronic circuit with elements external to the circuit itself (for example, for supplying to the integrated device control or data signals) also in a contactless (wireless) mode.

A communication cell of this type is provided, for example, in United States Patent Application Publication No. 2011/0171906 (incorporated by reference). However, said communication cell presents the disadvantage of being able to operate exclusively in contact mode or in capacitive contactless mode. Other contactless coupling modes are precluded. Furthermore, the operating mode must be defined beforehand and may not be defined automatically.

SUMMARY

An embodiment provides a communication cell for an integrated circuit, an electronic chip comprising said communication cell, an electronic system including said chip, and a test apparatus that will be able to extend the functionalities of the known art.

A communication cell for an integrated circuit, an electronic chip comprising said communication cell, an electronic system including said chip, and a test apparatus are provided.

In an embodiment, a communication cell for an integrated circuit comprises: a physical interface coupled to a first input terminal of the communication cell and configured to supply to the first input terminal an input signal, wherein, in a first operating condition, said input signal is a first operating signal supplied by a capacitive-signal source and, in a second operating condition, said input signal is a second operating signal supplied by an ohmic-signal source; and a first receiver circuit including a buffer configured to form an interface for reception of said second operating signal and generation of a second intermediate signal correlated to said second operating signal, a second receiver circuit including a transimpedance-amplifier circuit operatively coupled to said capacitive-signal source and configured to receive and amplify said first operating signal to generate a first intermediate signal; and an output stage configured to be coupled to said integrated circuit and including a selector device configured to receive the first intermediate signal and the second intermediate signal and to make available to said integrated circuit only the first intermediate signal in the first operating condition and only the second intermediate signal in the second operating condition.

In an embodiment, a communication method for an integrated circuit comprises the steps of: receiving, by a physical interface coupled to a first input terminal of the communication cell, an input signal, wherein, in a first operating condition, said input signal is a first operating signal supplied by a capacitive-signal source and, in a second operating condition, said input signal is a second operating signal supplied by an ohmic-signal source; and in the second operating condition, receiving by a buffer said second operating signal and generating a third intermediate signal correlated to said second operating signal, in the first operating condition, receiving and amplifying, by a second receiver circuit including a transimpedance-amplifier circuit, said first operating signal, thus generating a first intermediate signal; and receiving, by a selector device, the first intermediate signal and the second intermediate signal, and making available to said integrated circuit only the first intermediate signal in the first operating condition and only the second intermediate signal in the second operating condition.

BRIEF DESCRIPTION OF THE DRAWINGS

For a better understanding of the present invention a preferred embodiment thereof is now described, purely by way of non-limiting example, with reference to the attached drawings, wherein:

FIGS. 3A-3D show, respectively, a signal transmitted from outside to the communication cell of FIG. 1, a signal at input to the receiver of FIG. 2, a signal at an intermediate step of processing by the receiver of FIG. 2, and a signal at output from the receiver of FIG. 2;

DETAILED DESCRIPTION OF THE DRAWINGS

Figure 1:
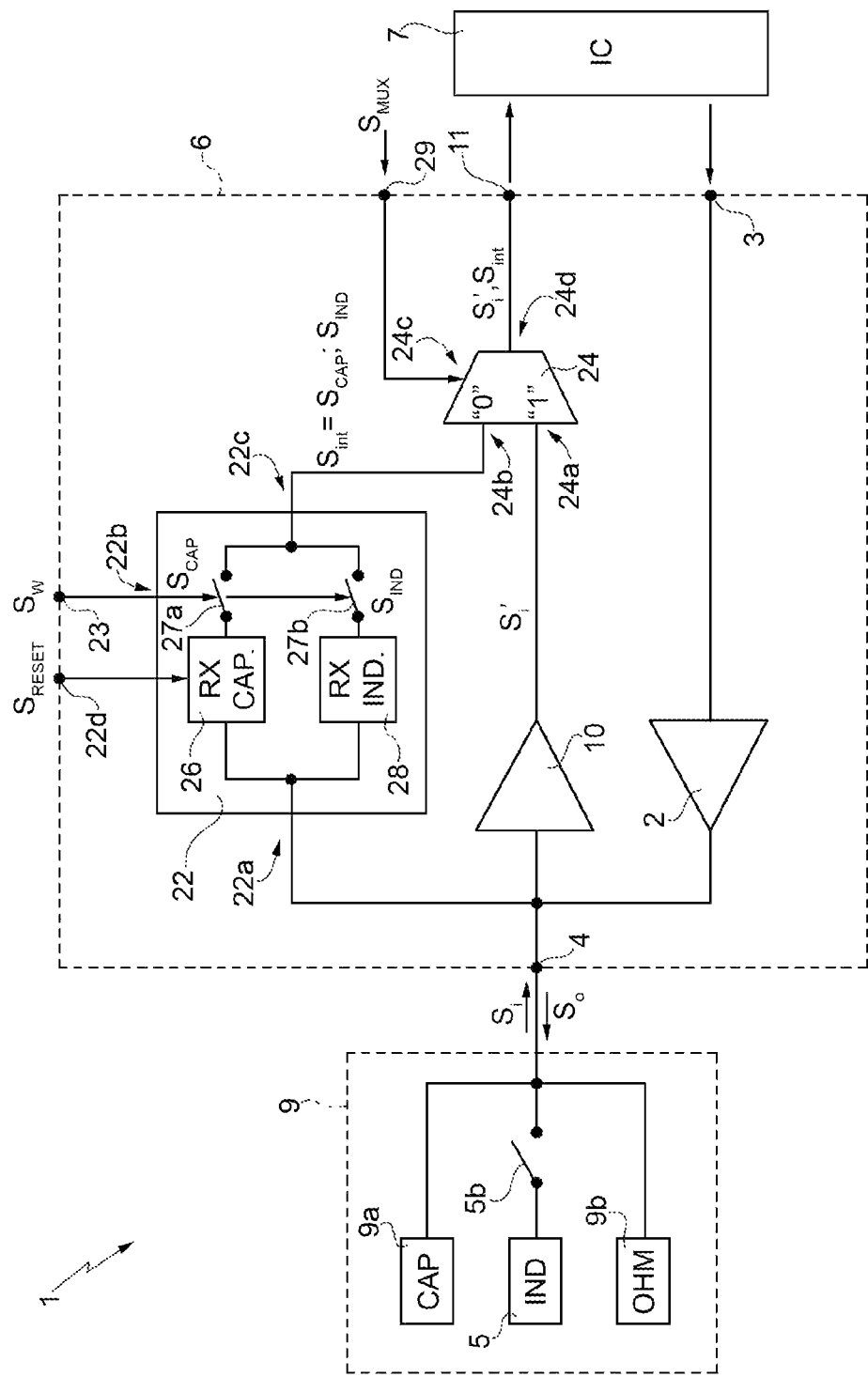
FIG. 1 shows a circuit diagram of a communication cell according to one aspect of the present invention.

FIG. 1 is a schematic circuit representation of a communication cell 1 according to one aspect. The communication cell 1 is of an input/output (I/O) type—i.e., it may function both in input mode (in this case it receives a signal supplied thereto from outside)—and in output mode—i.e., it generates a signal. In greater detail, the communication cell 1 comprises a communication circuit 6 connected between an external-interface node 4, from which it receives an input signal $S_i$, and an output port 11, designed to supply an output signal. The communication circuit 6 is operatively coupled to a plurality of physical-interface elements 9 via the external-interface node 4. The physical-interface elements 9 include, according to one embodiment, interface pads. The signal $S_i$ can be a data signal, or else a clock signal, or some other signal.

The communication circuit 6 includes a buffer circuit 10 (e.g., obtained with CMOS inverters cascaded to one another) and a selector device (multiplexer or mux) 24. In greater detail, the buffer circuit 10 is coupled between the external-interface node 4 and the selector device 24, whereas the latter is coupled between the output of the buffer circuit 10 and the output port 11 of the communication cell 1. The buffer 10 receives at input the signal $S_i$ and generates at output the signal $S_i'$, which has matched voltage levels (for example, for enabling compatibility with the voltage levels accepted at input by the selector 24). Furthermore, the buffer 10 decouples the source of the signal $S_i$ from the integrated circuit 7, thus preventing the source of signal from absorbing current.

Via the output port 11 the selector device 24 interfaces with a generic electronic circuit 7.

The communication circuit 6 further comprises a driving circuit 2, which includes a buffer, configured to receive, via an input port 3 of the communication cell 1, a signal coming from the electronic circuit 7, and supply an output signal $S_o$ for driving the external-interface node 4. In this way, the electronic circuit or integrated device 7 can communicate with the outside world, and the communication cell 1 thus operates in output mode.

The communication cell 1 is configured to enable two modes of external interfacing with the node 4: a direct-contact mode (ohmic contact) and a contactless or wireless mode. In particular, the contactless mode enables coupling of a capacitive type or, alternatively, of an inductive type at the external-interface node 4. For this purpose the physical interface 9 includes pads 9a and 9b and an antenna 5.

Capacitive coupling is obtained by operatively coupling the external-interface node 4 to a metal pad 9a, which, in use, functions as plate of a capacitor (the other plate of the capacitor is provided by an external system for access to the pad). According to one embodiment, a dielectric layer completely covers the metal pad 9a, to form the dielectric of the capacitor that, in use, comes to be formed between the external access system and the metal pad 9a. According to a different embodiment, the dielectric layer is not present, and the dielectric between the plates of the capacitor that is formed in use is air.

Inductive coupling is obtained by providing the antenna 5 in the form of integrated coil connected to the node 4 preferably via a switch 5b. The switch 5b has the function of preventing (when open) setting-up of a resonant circuit formed by coupling of the antenna 5 with the capacitor formed, in use, by the pad 9a and by possible parasitic capacitances present at the node 4. The switch 5b is thus open when the system operates in capacitive mode, and closed when it is operating in inductive mode.

According to an embodiment provided by way of example, the antenna 5 is a quadrangular coil inductor provided on a number of metal levels, for example seven, to obtain a total inductance of some tens of nanohenries, the exact value of which depends upon the design specifications (for example, manufacturing process, communication distance, area occupied, etc.). It is evident that the antenna 5 can be obtained in different ways, in terms of geometry and metal levels; for example, the antenna 5 can be a planar antenna. Access from outside to said antenna 5 is obtained by inductive coupling with an external antenna belonging to an external access system.

Ohmic coupling is obtained by providing a metal pad 9b designed to be ohmically contacted by an external system for access to the pad. This pad can be a further pad additional to the metal pad 9a (for example, in the case where the latter is covered by a dielectric layer), or else can coincide therewith.

The metal pad 9a that concurs in forming the capacitor for capacitive coupling is, according to one embodiment, directly coupled to the external-interface node 4. The antenna 5 for inductive coupling is coupled to the interface node 4 through the switch 5b. Thus, in use, the input signal $S_i$ can be the capacitive signal generated by capacitive coupling, or else the inductive signal generated by inductive coupling, or else the signal generated by ohmic contact, according to the various possible operating conditions of the communication cell 1 of the present invention. The signal $S_i$ at input to the node 4 is a digital signal in the case where the communication is of an ohmic-contact type. Otherwise, if the communication is inductive or capacitive, the signal $S_i$ is of an analog type.

In order to enable operation in contactless mode, in particular for acquiring signals at input to the communication cell 1, the communication circuit 6 comprises a receiver device 22. The receiver device 22 includes: an input port 22a connected with the external-interface node 4, from which it receives the input signal $S_i$; a first control input 22b, for receiving a control signal $S_W$ configured for identifying an operation of the receiver device 22 as capacitive or inductive receiver; and an output port 22c, configured to supply an intermediate signal $S_{int}$ at output from the receiver device 22. The intermediate signal $S_{int}$ is a voltage signal of a digital type and is a function of the input signal $S_i$.

The communication circuit 6 comprises a control input 22d, which acts on the receiver device 22, for receiving an initialization signal $S_{RESET}$ configured to initialize the communication circuit 6 in one of the operating modes (for example, in a contactless operating mode).

The receiver device 22 comprises a first receiving circuit 26 and a second receiving circuit 28. The first receiving circuit 26 is configured to receive the input signal $S_i$ and processing it when the communication cell 1 operates in capacitive-coupling contactless mode, supplying at output a signal $S_{CAP}$ correlated to the signal received at input $S_i$. The second receiving circuit 28 is configured to receive the input signal $S_i$ from the external-interface node 4 and processing it when the communication cell 1 operates in inductive-coupling contactless mode, supplying at output a signal $S_{IND}$ correlated to the signal received $S_i$.

The control signal $S_W$ is generated, according to one embodiment, outside the communication cell 1 and is supplied to the communication cell 1 via an input port 23 of the communication cell 1 itself. The control signal $S_W$ is, for example, a signal having a first logic value designed to enable operation of just one between the first and second receiving circuits 26, 28, and a second logic value designed to enable operation of the other between the first and second receiving circuits 26, 28. The control signal $S_W$ can also be generated by a logic integrated in the communication cell 1. According to a further embodiment, the control signal $S_W$ is set in the design stage to a fixed value, according to whether it is desired to use the communication cell 1 in the inductive operating mode or, alternatively, in the capacitive operating mode (according to the particular application for which the communication cell 1 is designed).

The embodiment of FIG. 1 illustrates the presence of two coupling switches 27a, 27b, which are designed to couple/decouple the first and second receiving circuits 26, 28 to/from the selector device 24. According to a per se known embodiment, the switches 27a and 27b can be constituted each by pairs of n-MOS and p-MOS transistors.

The control signal $S_W$ is supplied to a respective control terminal of the coupling switches 27a, 27b for switching on just one of the coupling switches 27a, 27b and switching off the other of the coupling switches 27a, 27b. In this way, it is possible to select which between the signals $S_{CAP}$ and $S_{IND}$ is supplied at input to the selector device 24, thus supplying the intermediate signal $S_{int}$.

As an alternative or in addition to the presence of the coupling switches 27a, 27b, the control signal $S_W$ can have the function of switching off one between the first and second receiving circuits 26, 28, for example by uncoupling one between the first and second receiving circuits 26, 28 from the electrical supply (for instance, by driving a respective switch that couples/decouples the electrical supply to/from the first and second receiving circuits 26, 28).

With reference once again to the selector device 24, the latter includes: a first input 24a connected with the external-interface node 4 via the buffer circuit 10, for receiving the signal $S_i'$, which is correlated to the input signal $S_i$; a second input 24b, connected to the output port 22c of the receiver device 22 for receiving the intermediate signal $S_{int}$ (i.e., one of the signals $S_{CAP}$ and $S_{IND}$); a control port 24c, connected to an input port 29 of the communication cell 1, for receiving a selection signal $S_{MUX}$ designed to select which input 24a, 24b must be supplied to the output of the selector device 24 (depending upon the type of operating mode, whether contact or contactless); and an output port 24d, configured to supply at output from the selector device 24 alternatively the input signal $S_i$ received at the first input 24a or the intermediate signal $S_{int}$, received at the second input 24b (on the basis of the selection signal $S_{MUX}$). The input signal $S_i$, or intermediate signal $S_{int}$, at output from the selector device 24 is supplied to the output port 11 of the communication cell 1.

Figure 2:
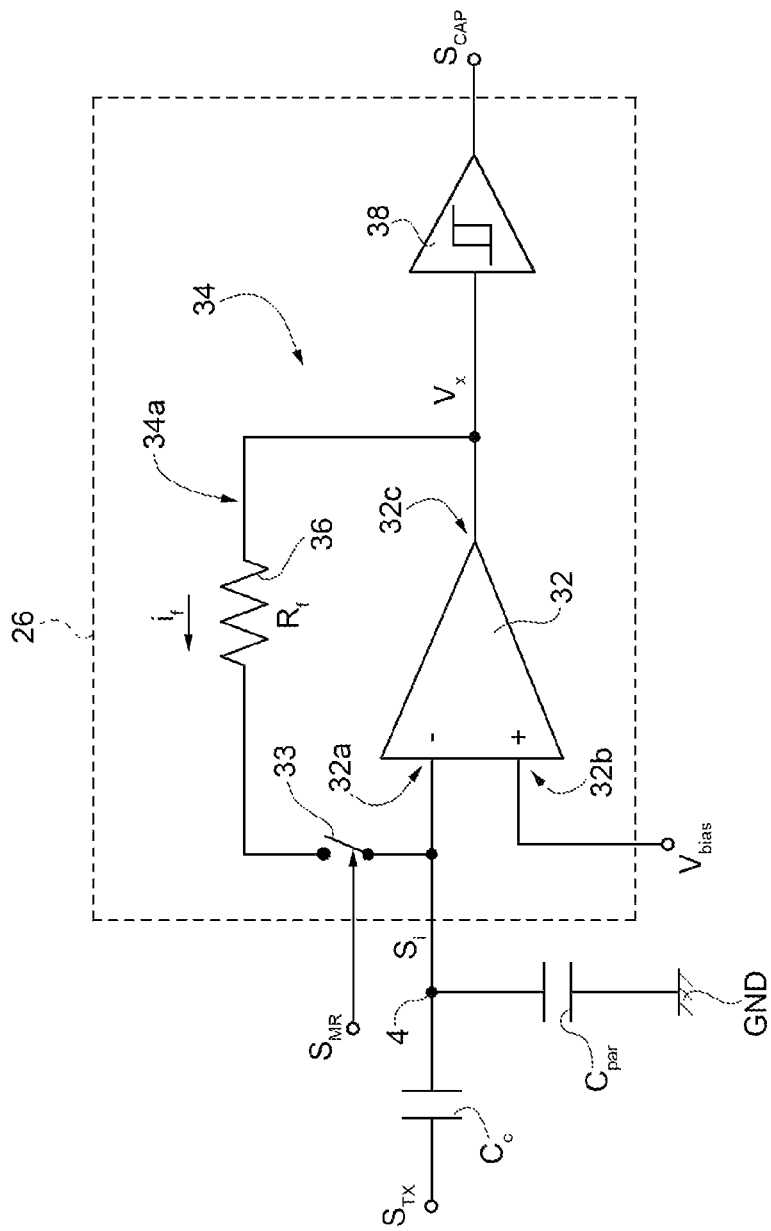
FIG. 2 shows a circuit diagram of a receiver for digital signals detected in capacitive-coupling mode in the communication cell of FIG. 1.

FIG. 2 shows, by a block diagram, a circuit designed to supply the first receiving circuit 26.

Present at the external-interface node 4, according to the representation of FIG. 2, is a coupling capacitor $C_C$, which, in use, is formed between the external-interface node 4 of the communication cell 1 (for example, as has been said, formed by the metal pad 9a) and a generic access device (provided with an own metal pad) used for accessing the communication cell 1 via capacitive coupling. This capacitor $C_C$ can have a value of capacitance of a few femtofarads (e.g., 3 fF for a distance between the plates that constitute the capacitor Cc of approximately 10 μm, with metal plates of a size of 50 μm×50 μm and air as dielectric). Further present between the external-interface node 4 and a ground reference terminal GND is a parasitic capacitor $C_{par}$, having a value of capacitance variable on the basis of the manufacturing process, typically of a few picofarads (e.g., 1 pF).

The value of capacitance $C_{par}$ of the parasitic capacitor may not be determined precisely beforehand. Consequently, it is not possible to indicate precisely, beforehand, the amplitude of the input signal $S_i$ that is received on the interface node 4. In particular, said signal $S_i$ depends not only upon the signal transmitted externally, but also upon the capacitive divider H formed by the input coupling capacitor $C_C$ and by the parasitic capacitor $C_{par}$. Said capacitive divider H is given by $H=C_C/(C_C+C_{par})$.

The input signal $S_i$ is consequently attenuated by the value H. Since generally the value of capacitance $C_{par}$ is higher than the value of capacitance $C_C$ (for example, 150 times as much), the input signal $S_i$ is a signal with a swing that is excessively low to be received and interpreted without ambiguity.

The first receiving circuit 26 comprises a transimpedance amplifier 34, for example formed by an operational amplifier 32, having an inverting input 32a coupled to the input-interface node 4 for receiving the input signal $S_i$ and a non-inverting input 32b biased at a reference biasing voltage $V_{BIAS}$. The reference biasing voltage $V_{BIAS}$ is chosen of a value such as to keep the operational amplifier in a high-gain regime.

Further present is a feedback branch 34a including a resistor 36 that electrically couples the output terminal 32c of the operational amplifier 32 to the inverting input 32a via a switch 33 driven by a signal $S_{MR}$. The signal $S_{MR}$ is obtained on the basis of the signals $S_{MUX}$ and $S_{RESET}$ in such a way that the signal $S_{MR}$ has a logic value "1" when $S_{MUX}$ has a logic value "0" and the reset signal is not active ($S_{RESET}$="0"), and $S_{MR}$ has a logic value "0" when $S_{MUX}$="1", or following upon application of the signal $S_{RESET}$. In the case provided by way of example considered herein we thus have $S_{MR}$=(/$S_{MUX}$ AND /$S_{RESET}$) where /$S_{MUX}$ is the signal $S_{MUX}$ negated, and /$S_{RESET}$ is the signal $S_{RESET}$ negated. When $S_{MR}$="1" the switch 33 is closed (i.e., it conducts current), whereas when $S_{MR}$="0" the switch 33 is open. In other words, during the capacitive-communication operating condition, the switch 33 is kept closed by the signal $S_{MR}$="1", whereas in the remaining operating modes (i.e., inductive and ohmic-contact modes) the switch 33 is kept open by the signal $S_{MR}$="0".

The signal $S_{RESET}$ drives the switch 33 into the open state when it is desired to operate in the inductive or ohmic-contact mode, thus preventing an "electrical conflict" on the input node 4.

The resistor 36 has an electrical resistance $R_f$ of a value such as to amplify the analog input signal $S_i$ and not cause saturation of the operational amplifier and enable the correct operating swing; for example, with a two-stage circuit topology of the amplifier, the value is of the order of tens of kiloohms. The value of resistance $R_f$ of the resistor 36 is chosen on the basis of the gain that it is desired to have on the input signal so that its output will have an amplitude such as to enable the circuits controlled by said output signal (e.g., the integrated circuit 7) to work properly.

It is pointed out that, in the capacitive operating mode, the input signal $S_i$ is the current that flows through the capacitance $C_C$.

Furthermore, the first receiving circuit 26 comprises a buffer 38, for example provided by a hysteresis comparator, or a Schmitt trigger, which has the function of restoring the logic levels of the signal $V_X$ supplied at output from the transimpedance amplifier 34, generating at output a digital signal $S_{CAP}$.

With reference to the transimpedance amplifier 34, during operation a feedback current $i_f$ circulates through the resistor 36 that tends to bring the voltage value applied to the inverting terminal 32a to the same voltage value $V_{BIAS}$ applied to the non-inverting terminal 32b. The voltage signal $V_X$ available on the output of the operational amplifier 32 consequently has a plot similar to that of the current $i_f$ amplified by a value equal to $R_f$. The current $i_f$ is equal to the current that circulates through the coupling capacitance $C_C$ minus the current that circulates through the parasitic capacitance $C_{par}$. The latter is negligible because the operational amplifier 32 functions in a high-gain condition and the feedback keeps the voltage on the node 4 approximately constant. The current $i_f$ is proportional to the derivative of a digital signal $S_{TX}$ transmitted through the coupling capacitance $C_C$.

It should be noted that the receiving circuit 26 thus provides a detection of the current generated by transition of the signal $V_{TX}$ (current sensing) that is independent of the value of the capacitive divider H mentioned previously.

FIGS. 3A-3D show by way of example the signal $S_{TX}$ at input to the coupling capacitance $C_C$ (FIG. 3A), the input signal $S_i$ (in this case a current signal, FIG. 3B), the signal $V_X$ at output from the transimpedance amplifier 34 (FIG. 3C), and the signal $S_{CAP}$ correlated to the signal $S_i$ and with the rising and falling edges regenerated. For greater clarity, the signals of FIGS. 3A-3C are represented using the same time scale (axis of the abscissae).

With reference to FIG. 3B, it should be noted that the passage from the high logic value to the low logic value, and vice versa, of the input signal $S_{TX}$ of FIG. 3 causes a corresponding variation of the signal $S_i$, i.e., the current through the input terminal 4, which presents an impulsive plot.

FIG. 3D shows the signal $S_{CAP}$ generated at output from the buffer 38. The signal $S_{CAP}$ is, substantially, a delayed reconstruction of the input signal $S_{TX}$, and presents logic levels restored and a plot similar to that of the input signal $S_{TX}$ of FIG. 3A. In this case, by way of example, the high logic value is approximately 2.5 V, and the low logic value is approximately 0 V, considering the values of the supply voltages used by the integrated circuit 7 of FIG. 1.

As already noted with reference to the receiver device 22 of FIG. 1, the latter further comprises the second receiving circuit 28, configured to receive input signals $S_i$ generated by inductive coupling. The external-interface node 4 is, in this case, coupled to the antenna 5 designed to acquire a signal generated inductively by an external transmission circuit (e.g., by supplying current pulses to a transmission antenna, or coil, using the circuit of FIG. 6).

Figure 4:
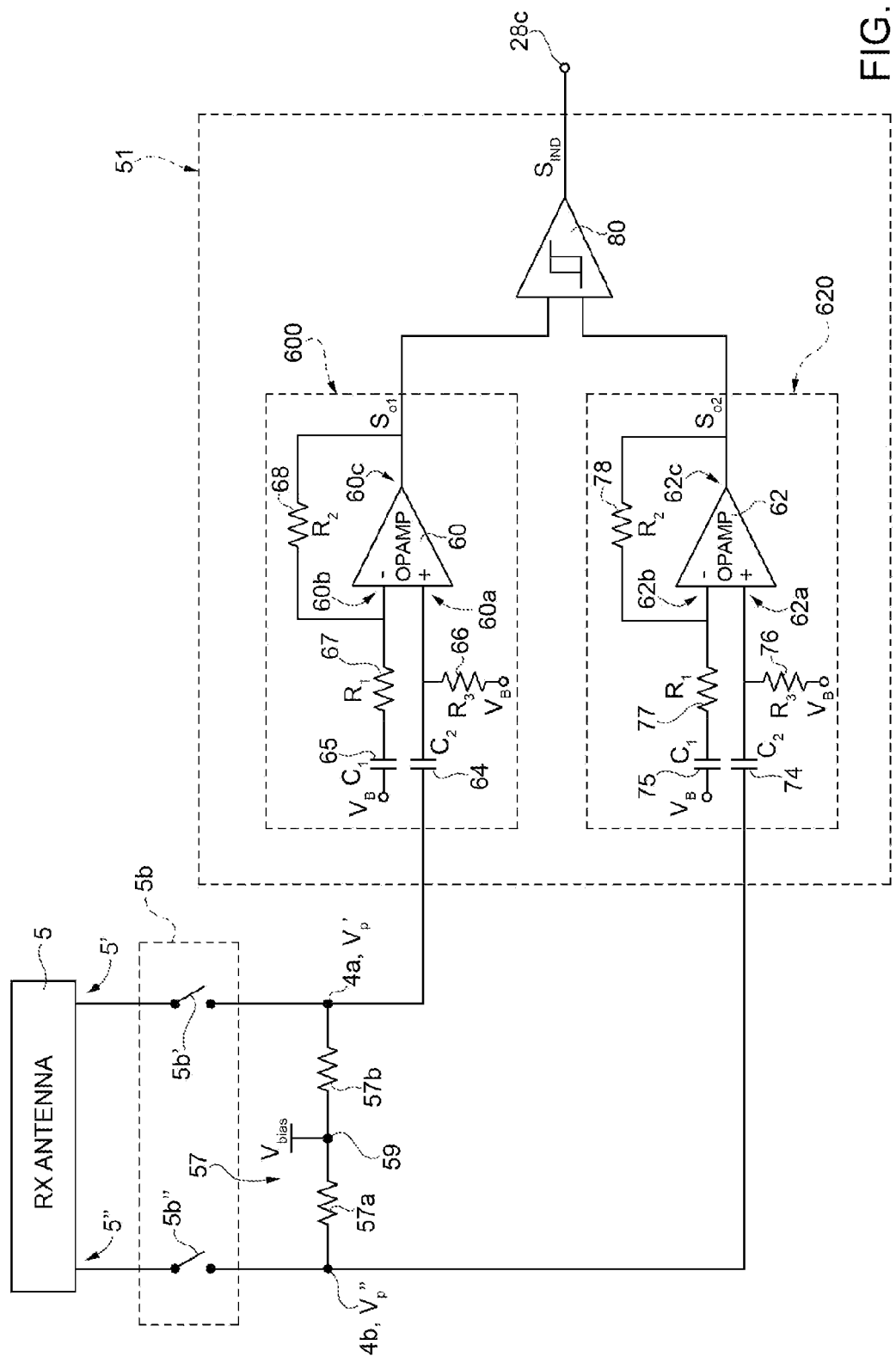
FIG. 4 shows a block diagram and a possible circuit embodiment of a receiver of digital signals that are detected in inductive-coupling mode in the communication cell of FIG. 1.

FIG. 4 shows the second receiving circuit 28 according to one embodiment. The external-interface node 4 of FIG. 1 is, in the embodiment of FIG. 4, decomposed into the two nodes 4a and 4b. The node for ohmic or capacitive coupling is the node 4a or 4b indifferently.

Two switches 5b', 5b" provide the switch 5b shown in FIG. 1 and enable decoupling of the antenna 5 from the communication circuit 6 of FIG. 1. The second receiving circuit 28 includes a first input and a second input 4a, 4b, which are designed to receive a differential voltage signal supplied by the receiving antenna 5, and an output 28c, designed to supply a signal $S_{IND}$ that is a function of the differential signal received at the inputs 4a, 4b. The signal $S_{IND}$ is a digital signal, designed to be processed by the electronic circuit or integrated device 7. The receiving circuit 28 will be better described in what follows.

Figure 5:
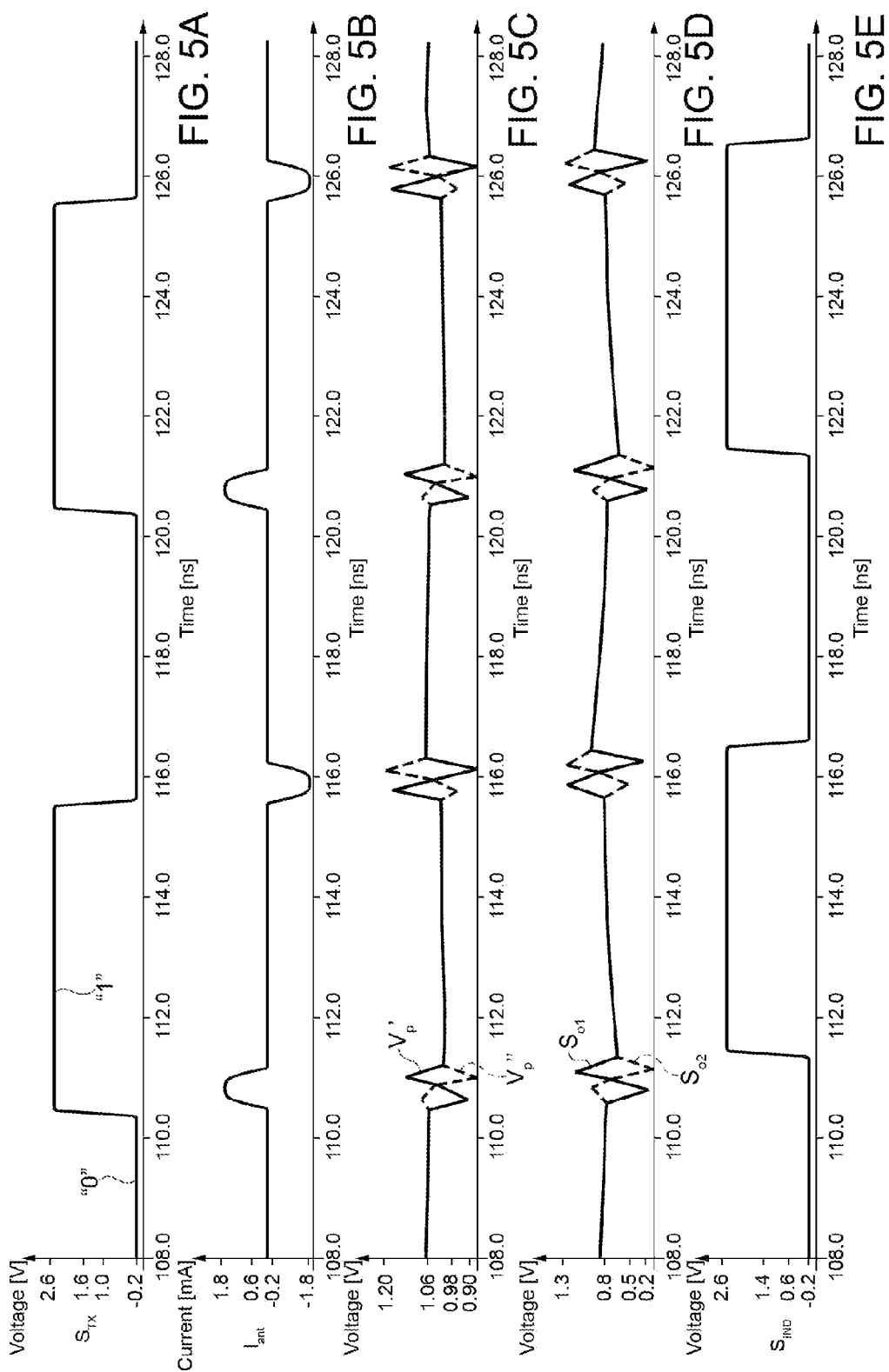
FIGS. 5A and 5B show a current signal that circulates on the transmitting antenna (FIG. 5B) induced on the basis of a digital voltage signal to be transmitted (FIG. 5A) generated by a transmitter external to the communication cell of FIG. 1.
FIGS. 5C and 5D show signals internal to the receiver of inductive signals of FIG. 4, during steps of processing of the signal of FIG. 5B.
FIG. 5E shows a signal at output from the receiver of inductive signals of FIG. 4, generated as a function of the signals of FIG. 5D.
Figure 6:
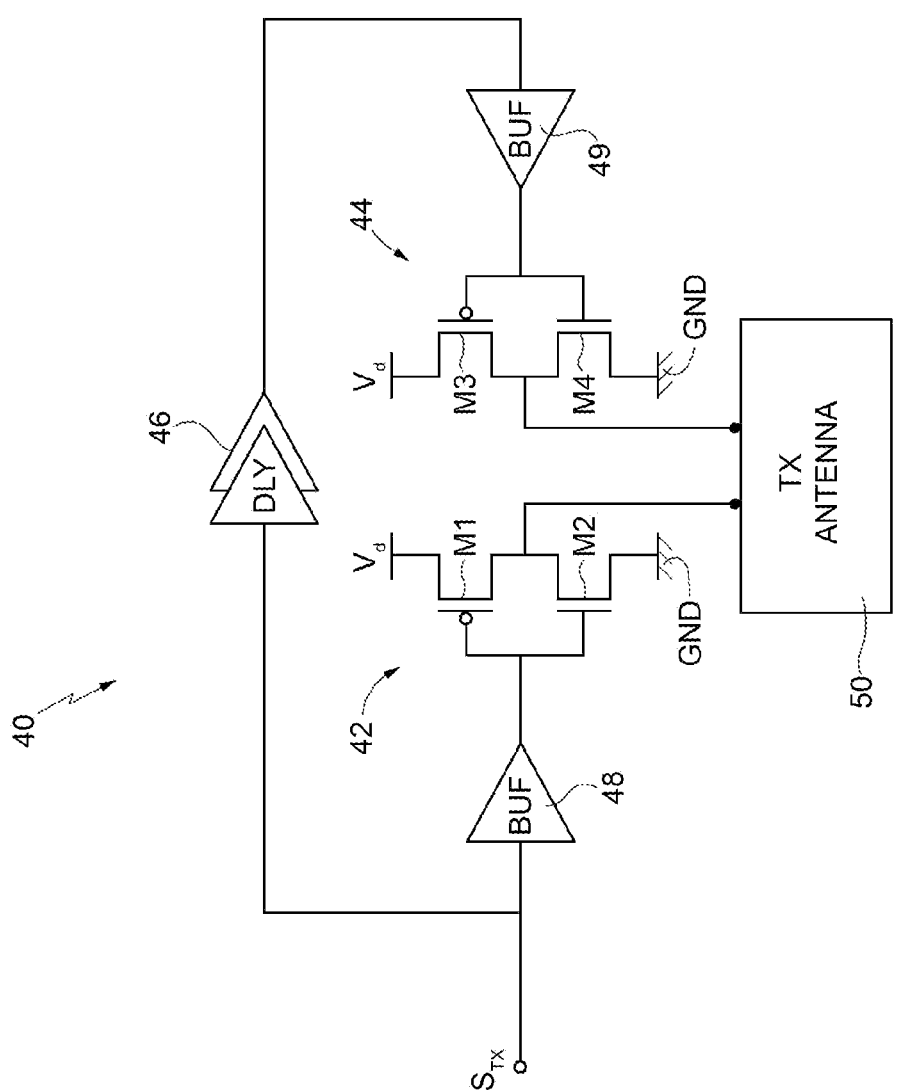
FIG. 6 shows a transmission circuit designed to generate a signal that can be detected by the receiver of inductive signals of FIG. 4 and in particular to generate the current signal of FIG. 5B.

With reference to FIG. 6, there now follows a description of an example of transmission circuit 40 external to the second receiving circuit 28, configured to transmit the signal $S_{TX}$ (digital signal) that is to be received and processed by the receiving circuit 28. The signal $S_{TX}$ transmitted is of the type shown in FIG. 5A.

For this purpose, the transmission circuit 40 includes a first inverter 42 and a second inverter 44 provided according to a prior-art scheme by transistors of a P-channel and N-channel CMOS type (in FIG. 6 these are the devices M1, M2, M3, M4) supplied by the supply voltage $V_d$ used in the transmission circuit. In a per se known manner, the first inverter 42 comprises a first transistor M1 and a second transistor M2, which are connected between a terminal biased at a voltage $V_d$ (e.g., 2.5 V) and a reference terminal GND, for example at an approximately zero voltage. At the low logic value "0" of the signal $S_{TX}$, the transistor M1 is on, whereas the transistor M2 is off, and vice versa.

The second inverter 44 is similar to the first inverter 42 and comprises a respective first transistor M3 and a second transistor M4, which are connected between the terminal biased at a voltage $V_d$ and the reference terminal GND. At the low logic value "0" of the signal $S_{TX}$ the transistor M3 is on, whereas the transistor M4 is off, and vice versa.

Preferably, the inverters 42, 44 are controlled by a respective buffer 48, 49 having the function of receiving the signal $S_{TX}$ and generate a control signal of the respective inverter 42, 44 correlated to the signal $S_{TX}$ but having an appropriate swing for driving the transistors M1-M4 of the respective inverters 42, 44 into the respective on and off states, or vice versa.

The transmission circuit 40 further includes a delayer element 46, for example provided by a chain of inverters in even number, configured to introduce a temporal delay on the signal $S_{TX}$ supplied to the inverter 44.

The output of the first inverter 42 is operatively coupled to a first conduction terminal of a transmitting antenna 50, for example provided in the form of planar coil, but it is evident, for the purposes of the present invention, that other embodiments are possible. The output of the second inverter 44 is operatively coupled to a second conduction terminal of the transmitting antenna 50.

Assume that, in an operating condition of the transmission circuit 40, the signal $S_{TX}$ has a low logic value "0" or a high logic value "1", the circuit 40 is in steady-state condition, and the two conduction terminals of the antenna 50 are both at a constant potential or value GND or value $V_d$ (low logic value or high logic value). Thus, there is no electric current flowing (FIG. 5B) and the antenna 50 does not transmit any signal. At a rising edge of the signal $S_{TX}$ (from the logic value "0" to the logic value "1"), the transistor M1 is off and the transistor M2 is on. The delayer circuit 46 enables the second inverter 44 to have the transistor M3 still on and the transistor M4 off.

Thus, during the interval defined by the delayer element 46, a current $I_{ant}$ flows through the transmitting antenna 50 (see the current pulse in FIG. 5B).

The opposite passage of logic state, i.e., from the high logic value "1" to the low logic value "0", of the signal $S_{TX}$ causes a respective flow of current through the transmitting antenna 50, with an opposite direction with respect to passage from the low logic value "0" to the high logic value "1" of the signal $S_{TX}$. FIG. 5B shows the generation of current pulses through the transmitting antenna 50 in both of the situations described.

The electromagnetic signal generated by the transmitting antenna 50 is received by the receiving antenna 5. The latter is obtained, as has been said previously, integrated on one or more metal levels, as a coil or with different geometrical shapes, having a first conduction terminal 5' and a second conduction terminal 5". As is known, when immersed in the electromagnetic field generated by the current that flows in the transmitting antenna 50, a differential voltage is induced on the receiving antenna 5, between the first and second conduction terminals 5', 5". There is thus generated a difference of potential between the nodes 4a and 4b. The condition just described arises when the switches 5b', 5b" are closed, i.e., when the communication circuit 6 of FIG. 1 functions in inductive mode. The first conduction terminal 5' of the receiving antenna 5 is operatively coupled to the input 4a of the second receiving circuit 28 through the switch 5b', whereas the second conduction terminal 5" of the receiving antenna 5 is operatively coupled to the input 4b of the second receiving circuit 28 through the switch 5b".

Coupled between the input 4a and the input 4b is a biasing circuit 57, configured to bias the nodes of the inputs 4a, 4b by a biasing voltage $V_{BIAS}$. In FIG. 5C the value shown of $V_{BIAS}$ is approximately 1V, considering that values of 2.5 V and 0 V for the high and low supply voltages have been respectively chosen.

According to one embodiment, the biasing circuit 57 includes a first resistor 57a and a second resistor 57b between the input 4a and the input 4b. The electrical node 59 between the first and second resistors 57a, 57b is biased at the biasing voltage $V_{BIAS}$, generated in a per se known manner by a voltage generator.

In this way, the value of voltage $V_P'$, $V_P''$ present on the respective inputs 4a, 4b is given by $V_{BIAS}$ plus a signal that is a function of the conduction current of the receiving antenna 5 (FIG. 5C).

The resistors 57a, 57b are, according to one embodiment, provided by p-MOS transistors driven into the on state, and biasing of the electrical node 59 is, for example, provided by a feedback inverter circuit coupled between the supply voltage and the reference voltage GND.

As may be noted from FIG. 5C, the signal $V_P'$ present on the input 4a shows a negative peak at the rising edge of the current signal supplied to the transmitting antenna 50 and a positive peak at the falling edge of the current signal supplied to the transmitting antenna 50. The signal $V_P''$ present on the input 4b has an opposite evolution. In fact, on the nodes of the inputs 4a and 4b there may be noted an evolution of the voltage that is proportional to the time derivative of the current that flows through the receiving antenna 5.

To return to FIG. 4, the receiving circuit 28 comprises a differential-amplifier stage 51 between the nodes 4a and 4b, including a first amplifier 600 and a second amplifier 620 (which are similar to one another in terms of circuit topology and functional parameters), and a hysteresis comparator 80.

A possible circuit embodiment of the amplifier 600 is illustrated in FIG. 4, and includes a first operational amplifier 60. The first operational amplifier 60 has the non-inverting input 60a coupled to the input 4a via a capacitor 64. This capacitor, having for example a value of capacitance of 50 fF, has the function of eliminating the d.c. component of the signal present on the input 4a. In this way, the signal supplied to the non-inverting input of the first operational amplifier 60 is a signal variable in time deprived of its d.c. component. Furthermore, the non-inverting input of the first operational amplifier 60 is connected to a voltage signal $V_B$, applied by a resistor 66. The voltage signal $V_B$ is chosen of a value such as to bias the operational amplifier in the high-gain area, whereas the value of resistance of the resistor 66 is chosen of a value such as to not jeopardize the dynamic performance of the circuit, for example, a value of 100 k$\Omega$.

The inverting terminal 60b of the first operational amplifier 60 is connected to the voltage signal $V_B$ via a capacitor 65, having for example a value of capacitance of 150 fF. In turn, the capacitor 65 is coupled in series to a resistor 67, which has, for example, a value of electrical resistance of 5 k$\Omega$. The capacitor 65 has the function of decoupling the output of the operational amplifier 60 from the input voltage $V_B$ (i.e., rendering the value of the output signal independent of the value of $V_B$). The output 60c of the first operational amplifier 60 is fed back to the inverting terminal 60b by a feedback branch that includes a resistor 68, having for example a value of electrical resistance of 45 k$\Omega$, which concurs with the resistor 67 in defining a gain of the first operational amplifier, in a known way (gain=1+$R_2/R_1$).

In use, the ensemble including the capacitors 64, 65, the resistors 66, 67, 68, and the operational amplifier 60, to which the signals previously described are supplied, provides an amplification of the signal $V_P'$ present on the input 4a (signal $S_{O1}$ of FIG. 5D).

The second amplifier 620 is, according to one embodiment, of the same type as the amplifier 600, and comprises components that are similar to those already described with reference to the amplifier 600 and that have the same function. Consequently, the second amplifier 620 will not be described in detail herein.

With reference to the second amplifier 620, it comprises: a second operational amplifier 62, similar to the first operational amplifier 60; a capacitor 75 and a resistor 77 (similar to the capacitor 65 and the resistor 67 described previously) connected together in series between the voltage terminal $V_B$ and the inverting input 62b of the operational amplifier 62; a feedback branch coupled between the output 62c and the inverting input 62b of the operational amplifier 62, including a resistor 78 (similar to the resistor 68); a capacitor 74 (similar to the capacitor 64) electrically coupled between the input node 4b and the non-inverting terminal of the operational amplifier 62; and a resistor 76 (similar to the resistor 66) coupled between the voltage $V_B$ and the non-inverting input 62a.

The second operational amplifier 620 provides an amplification of the signal $V_P''$ present on the input 4b (signal $S_{O2}$ of FIG. 5D).

The signals at output from the first and second amplifiers 600, 620 are designated in FIG. 4 by the references $S_{O1}$ and $S_{O2}$, respectively. These signals are further shown in FIG. 5D. The signals $S_{O1}$ and $S_{O2}$ are connected to respective inputs of a second comparator stage 80, in particular of a hysteretic differential type. The thresholds of the comparator are defined according to a prior-art scheme that takes into account the amplitudes of the signals $S_{O1}$ and $S_{O2}$. The comparator circuit 80 is, in particular, a differential sense amplifier with hysteresis. The transition of the output of the comparator circuit 80 is thus controlled by the difference signal $S_{O1}-S_{O2}$.

To return to FIG. 1, as described previously, the communication cell 1 can operate in contactless mode or else contact mode. As anticipated, one or other of the operating modes entails control of the selector device 24 by the signal $S_{MUX}$. In the case of operation in contact mode, the signal $S_{MUX}$ enables the input 24a of the selector device 24, transferring the input signal $S_i'$ onto the output 24d of the selector device 24; in the case of operation in contactless mode, the signal $S_{MUX}$ enables the input 24b of the selector device 24, transferring the signal $S_{int}$ supplied by the receiver device 22 onto the output 24d of the selector device 24.

The signal $S_{MUX}$ is a digital signal and acts downstream of the switches 27a and 27b driven by the signal $S_W$ (FIG. 1), which discriminates between contactless mode of a capacitive type and contactless mode of an inductive type. In the contactless mode of a capacitive type, according to one aspect of the present invention, the signal $S_{MUX}$ is generated by a detection circuit 90 of the type shown in FIG. 7. According to one embodiment, the detection circuit 90 is formed in the integrated form in the communication cell 1 and thus forms part of the communication cell 1 itself.

According to a different embodiment, the detection circuit 90 can be external to the communication cell 1 and operatively coupled to the latter in such a way as to supply the signal $S_{MUX}$.

The detection circuit 90 is configured to detect automatically whether an interface external to the communication cell 1, for example a probe or tip of a test apparatus, is in direct contact (ohmic contact) with the metal pad 9b coupled to the external-interface node 4, or else, if it is coupled in contactless mode, to the metal pad 9a.

The detection circuit 90 comprises an internal biasing block 92, having a high output resistance, which can be provided for example with a p-MOS transistor 92a and an n-MOS transistor 92b in below-threshold operating conditions according to a prior-art modality. The transistors 92a, 92b have their respective drain terminals connected together at an electrical node 93, whereas the source terminal of the transistor 92a is coupled to $V_{DD}$ and the source terminal of the transistor 92b is coupled to the ground reference voltage GND.

According to one embodiment of the present invention, the control signal $S_{RESET}$ initializes the communication circuit 1 in FIG. 1 in the contact operating mode and forces the switch 33 of FIG. 2 into the open state, interrupting the feedback branch 34a. If, after the action of the initialization signal $S_{RESET}$, the operating mode is capacitive, the external-interface node 4 remains floating. Consequently, the only biasing contribution of the input node 4 to the transistors 95 and 96 is the circuit 92, and the biasing value is fixed by the sizing of the transistors 92a and 92b chosen in such a way that the voltage on the conduction node 93, which coincides with the node 4, is of a value comprised between the high supply value $V_{DD}$ (e.g., 2.5 V) and the low reference value GND (e.g., 0 V) for keeping in conduction both the transistor 95 and the transistor 96.

The detection circuit 90 further comprises a current mirror 94 including a p-MOS transistor 94a belonging to the input branch 97 of the current mirror 94, and a second p-MOS transistor 94b belonging to the output branch 98 of the current mirror 94. The gate terminals of the first and second transistors 94a, 94b are electrically connected together and to the drain terminal of the transistor 94a, thus providing the current mirror 94. The current that flows in the branch 97 of the current mirror 94 is thus fed back to the branch 98. The gate terminal of the transistors 94a and 94b is also connected to the gate terminal of the transistor 104, which is thus turned on if current circulates in the branch 97.

The first branch 97 of the current mirror 94 includes an inverter, which is formed by the p-MOS transistor 95 and an n-MOS transistor 96 and has the input connected to the terminal 93 that coincides with the terminal 4. In this way, in use, after application of the signal $S_{RESET}$, if the operating mode is contactless, biasing of the gate terminals of the transistors 95 and 96 is guaranteed by the biasing voltage present on the conduction node 93 generated by the circuit 92, which is of a value, as previously described, such as to keep both of the transistors 95 and 96 in the on state.

A second current mirror 102 includes a transistor 102a, coupled to the transistor 94b in such a said that they have their own respective drain terminal in common. The source terminal of the transistor 102a is biased at the low supply voltage, for example the ground voltage GND. Furthermore, the gate and drain terminals of the transistor 102a are connected together. The second current mirror 102 further includes a transistor 102b, having the gate terminal coupled to the gate terminal of the transistor 102a. The source terminal of the transistor 102b is biased at the ground reference voltage GND. Both of the transistors 102a and 102b are, in this embodiment, of an n-MOS type.

The drain terminal of the transistor 102b of the second current mirror 102 is coupled to the drain terminal of the transistor 104, of a p-MOS type, having the gate terminal biased by the same biasing voltage as the transistors 94a and 94b of the current mirror 94.

The detection circuit 90 further comprises a comparator 106, having the inverting input terminal 106a coupled to a reference-voltage generator (not shown) in order to generate a comparison voltage signal $S_{CMP}$. The non-inverting terminal of the comparator 106 is instead coupled to an electrical node 107 defined between the transistors 94b and 102a, for receiving the voltage $S_{107}$ present on the node 107. The comparison voltage signal $S_{CMP}$ has a value such as to discriminate between the voltage values present on the node 107 in the respective operating conditions in which current circulates or does not circulate in the branch 98.

The result of the comparison between the signals $S_{CMP}$ and $S_{107}$ is indicative of the operating condition of the detection circuit 90. When the transistors 95 and 96 are both driven in conduction by the leakage current of the transistors 92a, 92b, the circuit operates in the condition where current circulates on the branch 97. This current is mirrored on the branch 98, and the voltage on the node 107 is brought to a value such that $S_{107} > S_{CMP}$ and the output of the comparator 106 assumes a high logic value "1", thus switching the transistor 112 off. The voltage value on the node 116 depends upon sizing of the transistors 104 and 102b and is chosen in a way such that it is recognized as low logic value by the chain of inverters 120. The output of this chain of inverters 120 is the signal $S_{MUX}$, which controls the selector 24 of FIG. 1, thus selecting the input $S_{int}$. Simultaneously, by controlling the switch 33 of FIG. 2, the signal $S_{MUX}$ closes the feedback 34a of the transimpedance amplifier 32 (i.e., by driving the switch 33 by the signal $S_{MR}$). Consequently, in this operating condition and once all the transients have terminated, the voltage on the node 4 (signal $S_i$) is controlled at the value $V_{BIAS}$. With reference once again to FIG. 7, the voltage $V_{BIAS}$ on the node 4 is such as to keep the transistors 95 and 96 both in conduction and keep the logic value of the signal $S_{MUX}$ at "0".

Instead, if after application of the signal $S_{RESET}$ operation is according to the contact operating mode, the external-interface node 4 is forced by a transmitter circuit with low output impedance (for example, a digital buffer) and the signal $S_i$ assumes the high logic value "1" and the low logic value "0" of a digital signal, such as, for example, the signal $S_{TX}$ of FIG. 3A. The value of said signal $S_i$ is such as to drive into the on state one of the transistors 95 and 96 and into the off state the other of the transistors 95 and 96, irrespective of the presence of the biasing signal generated by the transistors 92a, 92b. In other words, in steady-state conditions, the voltage values corresponding to the high and low logic values of the signal $S_i$ are such as to keep in conduction one and only one of the transistors 95 and 96. In this case, since one of the transistors 95 and 96 is always off, there does not flow current in the branch 97, and the current in the output branch 98 of the mirror 94 is zero and the transistor 104 is off.

The voltage value of the signal $S_{107}$ is brought to a low value such as to force a zero current on the input of the current mirror 102, thus biasing the transistor 102a in the off condition. In these conditions, the voltage value on the node 107 is low and guarantees $S_{107} \leq S_{CMP}$. The output of the comparator 106 thus assumes the low logic value "0" sending into conduction the transistor 112, which is traversed by a current for charging the capacitor 110, thus sending the voltage value on the node 116 to the value $V_{DD}$, and also the signal $S_{MUX}$ goes to the high value. With reference to FIG. 1, the selector 24 selects the signal $S_i'$, and the feedback branch 34a in FIG. 2 is open.

Switching-on and switching-off of the transistor 112 are thus controlled by the output of the comparator 106. In this way, when the output of the comparator is the low logic signal "0", the transistor 112 is on and the capacitor 110 is charged; when the output of the comparator is the high logic signal "1", the transistor 112 is off and the capacitor 110 is discharged.

The node 116 is connected to the output of the detection circuit 90. In other words, the output of the detection circuit 90 is the signal across the capacitor 110.

In order to guarantee a digital output signal having well-defined rising and falling edges, a chain of an even number of inverters 120 is present (here, two inverters 122, 123), configured to receive the signal on the node 116 and supply at output a digital signal correlated to the signal across the capacitor 110. The signal supplied at output from the chain of inverters is the signal $S_{MUX}$ described previously.

The presence of the capacitor 110 and of the transistors 104, 112 and 102b guarantees that, during transition of the signal $S_i$ from the voltage values corresponding to the high and low logic values, and vice versa, the voltage on the node 116 may not drop to values such as to cause switching of the inverter 122 and, in particular, thus guarantees that the signal $S_{MUX}$ will remain constant at the high value. The capacitor 110 is thus sized in such a way that its discharge time is longer than the duration of the transient of the signal $S_i$ present on the input node 4.

Consequently, according to the embodiment described, a high logic value of $S_{MUX}$ identifies the contact operating mode; instead, a low logic value of $S_{MUX}$ identifies of the contactless operating mode, as indicated in FIG. 1.

Figure 7:
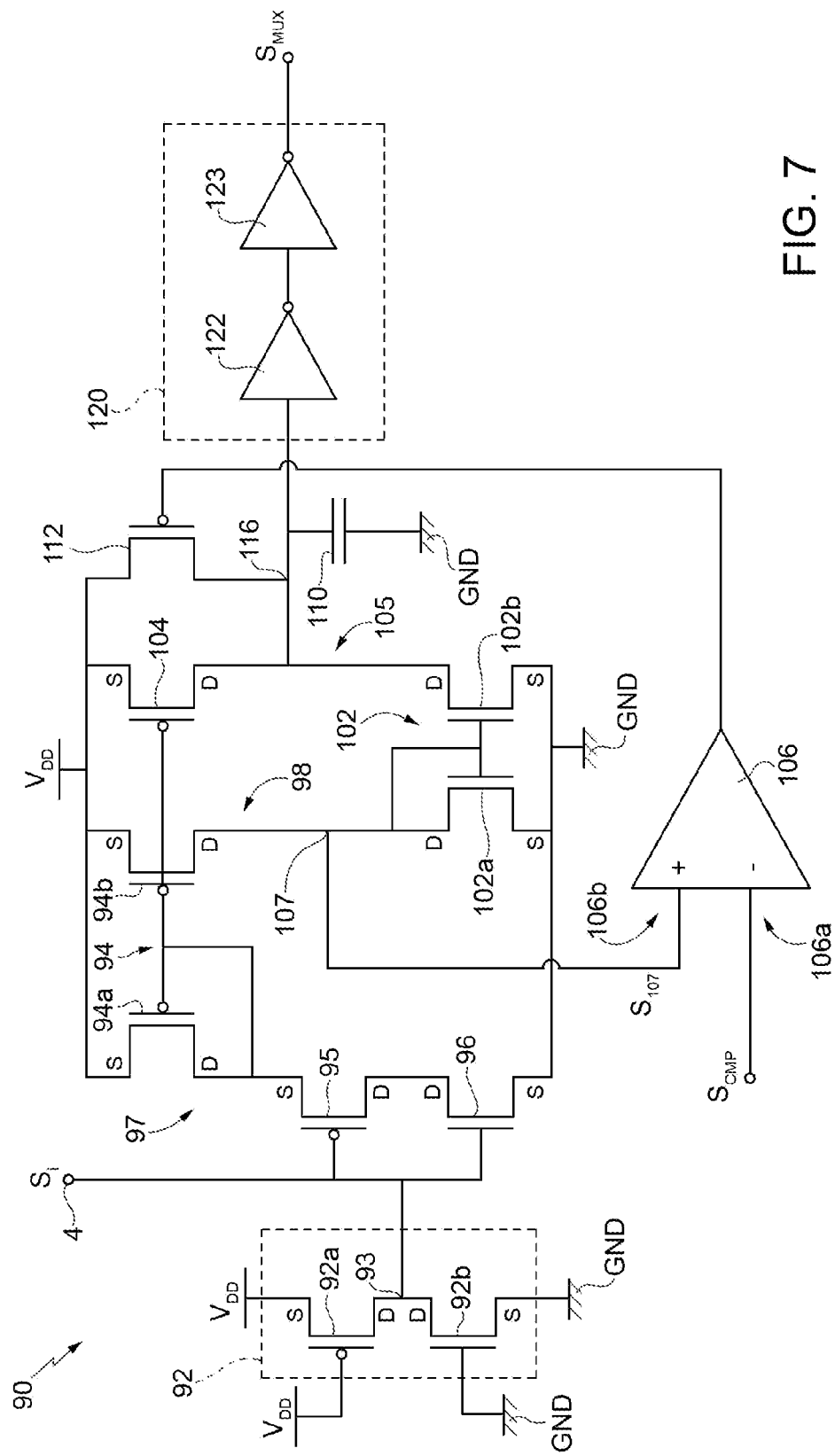
FIG. 7 shows an electronic circuit for detecting an operating mode of the communication cell of FIG. 1 chosen between ohmic-contact operating mode and capacitive contactless operating mode.

The detection circuit 90 of FIG. 7 is also able to identify passage from a contact mode to a contactless mode. Following upon this passage, the voltage $S_i$ on the node 4 is no longer forced by an external low-impedance transmitter circuit, and thus its value is determined by the biasing circuit 92, exactly as in the case immediately subsequent to application of a reset as described previously.

The communication cell 1 described, in its totality or portions thereof, which thus guarantee one or more of the operating modes, finds various applications in electronic systems.

The communication cell 1 finds application in electronic systems of an integrated type that must be subjected to a testing step for evaluating a proper operation thereof. Electronic systems that comprise a plurality of communication cells 1 can interface with test probes indifferently of a contact or contactless type, according to the particular requirements and/or of the instrumentation available for carrying out the test.

Figure 8:
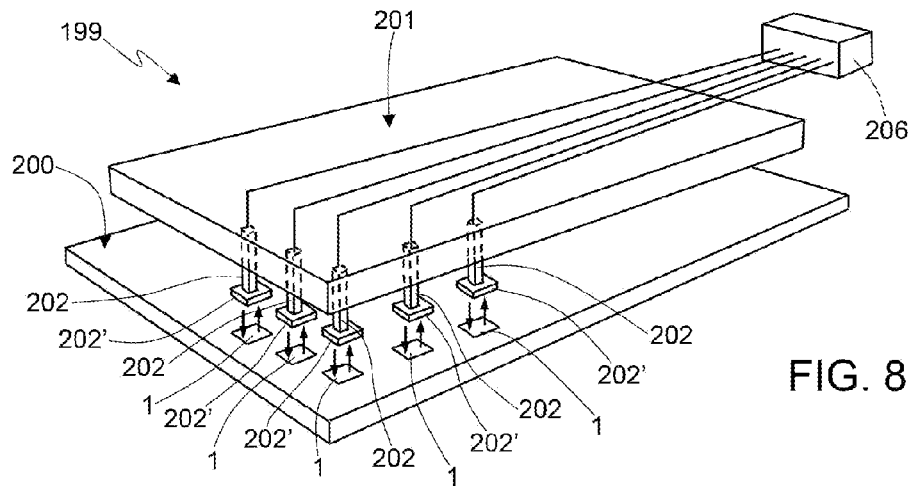
FIG. 8 shows a test device for an integrated circuit comprising a plurality of communication cells of FIG. 1.

FIG. 8 shows a test system 199 for a device under test 200 (for example, an integrated circuit). The test system 199 comprises an array of probes 201 (known as "probe card") comprising a plurality of probes 202 configured to operate in contactless mode. In particular, the array of probes 201 comprises a plurality of probes 202 configured to capacitive and/or inductive couple with a respective plurality of communication cells 1 belonging to the device under test 200. Alternatively, the probes 202 can be configured to couple with a respective communication cell 1 both in contact mode and contactless mode. In this latter case, for example, each probe 202 comprises a terminal portion 202' formed by a respective metal pad designed for capacitive coupling with the metal pad 9a, or including an antenna designed to be positioned in the proximity of the antenna 5 of the communication cell 1. In the latter case, each probe 202 further comprises a circuit 40 of the type shown in FIG. 6, in order to be able to communicate in data transmission, with inductive coupling, with a communication cell 1 of the device under test 200.

Each probe 202 is further connected to a test station 206, from which it receives test signals for the device under test 200 and to which it sends signals of response of the device under test 200 to the test signals so that they can be analyzed.

Figure 9:
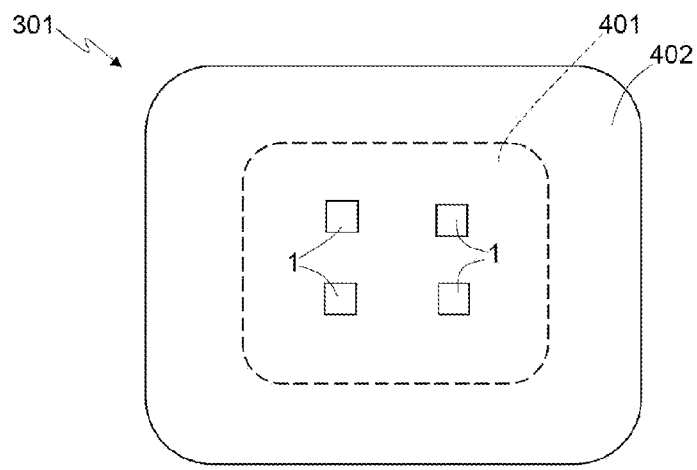
FIG. 9 shows, in top plan view, a chip comprising a plurality of communication cells, which are arranged in a central portion of said chip.

In addition, as shown in FIG. 9, testing communication cells 1 can be arranged in any area of a generic chip 301. For example, the chip 301 comprises a central portion 401 surrounded by a peripheral portion 402. In particular, one or more of the communication cells 1 can be arranged within the central portion 401, and be in any case easily accessible by capacitive or inductive connection. This is particularly advantageous in integrated chips or circuits of a pad-limited type, in which the number of communication cells 1 that can be obtained in the peripheral portion 402 of the chip 301 is limited.

Figure 10:
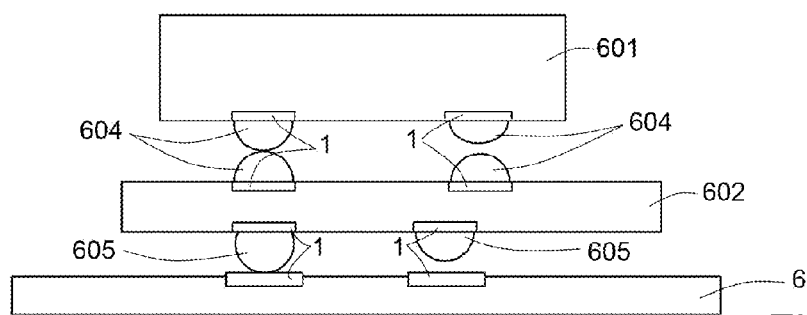
FIG. 10 shows a plurality of chips, which comprise a respective plurality of communication cells of FIG. 2 connected together by said communication cells, thus enabling a 3D integration of said chips.

Further, an additional application regards assembly of one or more chips in a package according to a mode with physical contact obtained by microbumps (FIG. 10). In this mode of use, the communication cell 1 previously described (provided with the detection circuit 90 of FIG. 7) can be in the contact operating mode or, indifferently, in the contactless operating mode of a capacitive type. The pads 9a and 9b coincide with one another in a single common metal pad. The microbump process, according to the known art, is carried out at this common pad 9a/9b.

FIG. 10, shows, according to the present invention, a first chip 601 connected to a second chip 602 via a plurality of electrical-connection elements 604 (for example, bumps, stubs, through-silicon vias, etc.). The second chip 602 is thus connected to a substrate 606 via a respective plurality of electrical-connection elements 605. Furthermore, each electrical-connection element 604, 605 is interfaced with the respective chip 601, 602 and with the substrate 606 via a communication cell 1 of the type described previously, which is provided with the circuit 90 of FIG. 7, as has been said. In this way, if, for example on account of the variations of manufacturing process or oxidation, one or more electrical-connection elements 604, 605 do not have an adequate thickness to enable an ohmic connection with the respective electrical-connection element 604, 605 that it faces (see, for example, in FIG. 10, the electrical-connection elements 604, 605 on the right), the communication in transmission and reception is in any case guaranteed in capacitive-coupling contactless mode according to what has already been described previously. In this way, it is evident that the reliability and the production yield are considerably increased.

From an examination of the characteristics of the invention provided according to the present disclosure, the advantages that it affords are evident.

In the capacitive transmission mode, the receiving circuit 26 provides a detection of the current generated by the transition of the signal $V_{TX}$ (current sensing) and not of the voltage attenuated by the capacitive divider H, as occurred instead in the situation described in US 2011/0171906. This renders the sensitivity of the circuit proposed much more independent of the value of the parasitic capacitances present on the input node 4 and thus enables correct reception for lower values of the coupling capacitance $C_C$.

In particular, the detection circuit 90 of FIG. 7 enables detection of the ohmic-contact operating mode or of the capacitive contactless mode and consequently correct forcing of the selection signal of the selector device 24.

The communication cell 1 can be used instead of standard digital library I/O pads for enabling electrical wafer sorting (EWS) of electronic devices according to the modality that, according to the circuit to be tested, is more convenient, thus obtaining an increase of the yield of the testing process.

Furthermore, the communication cell 1, for example deprived of the antenna 5 and of the circuit 28, can be used instead of standard library I/O pads for enabling proper communication between the integrated device 7 and other contact-mode devices, for example via microbumps, also in the presence of non-idealities of the process of creation of the ohmic interconnections themselves, thus obtaining an increase of the yield of the packaging process. In fact, in the case of absence of ohmic contact, the communication is in any case possible by exploiting in an automatic way the capacitive communication mode.

Pads enable access to generic integrated circuits without the aid of probes of a mechanical type, which operate in direct electrical contact. Furthermore, they enable intra-chip communication and 3D integration in an economically advantageous way of compact chips without electrical wire connections. Furthermore, the transfer of data between communication cells according to the invention is possible also at high frequency, rendering possible communication, for example, between different chips at a high speed.

Finally, it is clear that modifications and variations may be made to the invention described and illustrated herein, without thereby departing from the scope thereof, as defined in the annexed claims.

Figure 11:
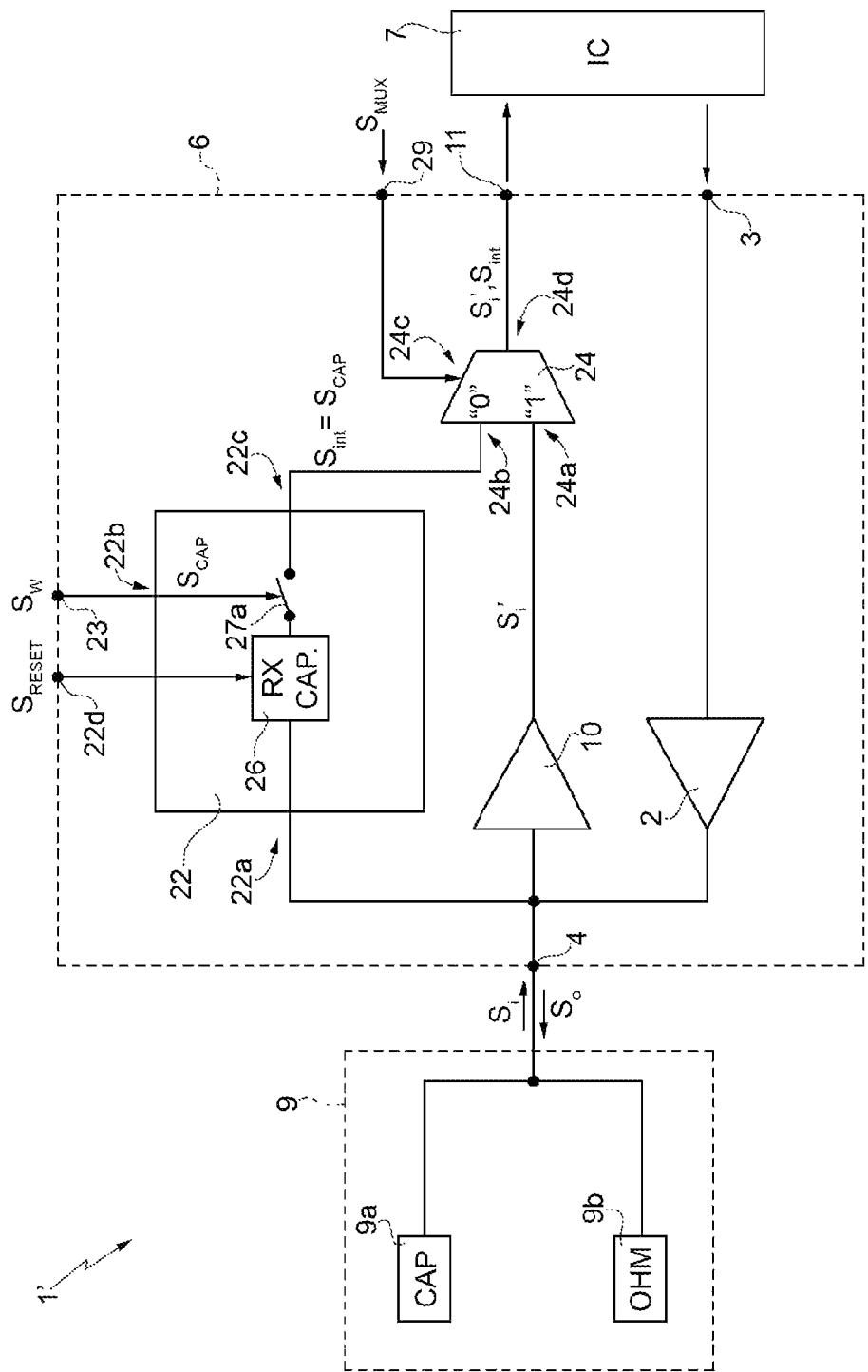
FIG. 11 shows a communication cell according to an embodiment alternative to that of FIG. 1.

According to one embodiment, shown in FIG. 11, the communication cell 1 (in FIG. 11 designated by the reference 1') comprises just the conductive pads 9a and 9b (possibly coinciding with one another in a single pad), and not the antenna 5. In this case, the detection circuit 28 is not present either, and the communication cell 1 operates only in the ohmic-contact and capacitive mode. The remaining circuit elements of the communication cell 1' of FIG. 11 correspond to those already illustrated with reference to the communication cell 1 of FIG. 1 and are not described any further herein.

The communication cell 1' integrates, according to one embodiment, the detection circuit 90 of FIG. 7. Furthermore, the communication cell 1' can be used instead of the communication cell 1 in the embodiments described with reference to FIGS. 8, 9, and 10.

According to a different embodiment (not shown in the figures), the communication cell of the present invention comprises the conductive pad 9b and the antenna 5, and not the pad 9a. In this case, the detection circuit 26 is not present either, and the communication cell 1 operates in just the ohmic-contact and inductive mode. In this embodiment, the circuit 90 of FIG. 7 can be omitted.

According to a further embodiment (not shown in the figures), alternative to the previous one, the communication cell of the present invention comprises the conductive pad 9a and the antenna 5, and not the pad 9b. In this case, the buffer 10 can be omitted, and the communication cell operates just in the capacitive and inductive modes.

The invention claimed is:

1. A communication cell, comprising:
   a physical interface coupled to a first input terminal of the communication cell and configured to supply to the first input terminal an input signal,
   wherein, in a first operating condition, said input signal is a first operating signal capacitively coupled to the physical interface and supplied by a capacitive-signal source and, in a second operating condition, said input signal is a second operating signal ohmically coupled to the physical interface and supplied by an ohmic-signal source; and
   a first receiver circuit including a buffer configured to form an interface for reception of said second operating signal and generation of a second intermediate signal correlated to said second operating signal;
   a second receiver circuit including a transimpedance-amplifier circuit operatively coupled to said capacitive-signal source and configured to receive and amplify said first operating signal to generate a first intermediate signal;
   an output stage configured to be coupled to said integrated circuit and including a selector device configured to receive the first intermediate signal and the second intermediate signal and to make available to said integrated circuit only the first intermediate signal in the first operating condition and only the second intermediate signal in the second operating condition.

2. The communication cell according to claim 1, wherein, in a third operating condition, said input signal is a third operating signal supplied by an inductive-signal source, said communication cell further comprising:
   a third receiver circuit including a differential-amplifier circuit configured to be operatively coupled to said inductive-signal source to receive and amplify said third operating signal to generate a third intermediate signal, wherein said selector device is further configured to receive the third intermediate signal and to make available to said integrated circuit only one from among the first intermediate signal, the second intermediate signal, and the third intermediate signal during the respective first, second, and third operating conditions.

3. The communication cell according to claim 2, wherein said capacitive-signal source comprises a metal pad that forms, in use, a plate of a capacitor configured to generate the first operating signal; wherein said ohmic-signal source comprises a metal pad that forms, in use, a plate configured to be ohmically contacted for generating the second operating signal; and wherein said inductive-signal source comprises an antenna that forms a first winding of a transformer configured to be coupled with a further antenna external to said communication cell that forms a second winding of said transformer to generate, in use, said third operating signal.

4. The communication cell according to claim 1, further comprising a detection circuit configured to detect the first and second operating modes, including:

an input stage configured to generate an operating signal that has a first value in the first operating condition and a second value, different from the first value, in the second operating condition; and a comparator configured to receive the operating signal and a comparison signal and to output a control signal representing one of the first operating condition or the second operating condition.

5. The communication cell according to claim 4, wherein said input stage includes the series of a first input switch and a second input switch which are complementary to one another and which have a respective control terminal adapted to receive the input signal, the communication cell further including a biasing circuit operatively coupled to the control terminal of the first and second input switches for supplying a biasing signal, the input signal and the biasing signal being competitive with one another in such a way that, in the first operating condition, both the first and second input switches are turned on by the biasing signal, thus generating the operating signal having the first value, and, in the second operating condition, at least one between the first and second input switches is turned off by the input signal thus generating the operating signal having the second value.

6. The communication cell according to claim 3, wherein said antenna comprises a first conduction terminal and a second conduction terminal, the first conduction terminal being coupled to said first input terminal and the second conduction terminal providing a second input terminal; and wherein the third receiver circuit comprises a differential-amplifier stage coupled to the first and second input terminals including a first amplifier and a second amplifier and a hysteresis comparator, the first amplifier including an operational amplifier having: a non-inverting input coupled to the first input terminal via a capacitor and being further connected to a biasing-voltage signal; an inverting input connected to the biasing-voltage signal via a respective capacitor and a respective resistor; and an output terminal coupled to the inverting input via a first feedback resistor, the second amplifier including an operational amplifier having: a non-inverting input coupled to the second input terminal via a respective capacitor and being further connected to a biasing-voltage signal; an inverting input connected to the biasing-voltage signal via a respective capacitor and a respective resistor; and an output terminal coupled to the inverting input via a second feedback resistor, said hysteresis comparator having respective input terminals which are coupled to the output terminals of the first and second amplifiers and generate said third intermediate signal.

7. The communication cell according to claim 1, implemented as an integrated circuit device.

8. The communication cell according to claim 1, wherein said communication cell is further coupled to a test probe of a test station configured to generate test signals.

9. A communication method for an integrated circuit, comprising the steps of:

receiving, by a physical interface coupled to a first input terminal of the communication cell, an input signal, wherein, in a first operating condition, said input signal is a first operating signal supplied by a capacitive-signal source capacitively coupled to the physical interface and, in a second operating condition, said input signal is a second operating signal supplied by an ohmic-signal source ohmically coupled to the physical interface; and in the second operating condition, receiving by a buffer said second operating signal and generating a third intermediate signal correlated to said second operating signal, in the first operating condition, receiving and amplifying, by a second receiver circuit including a transimpedance-amplifier circuit, said first operating signal, thus generating a first intermediate signal; and receiving, by a selector device, the first intermediate signal and the second intermediate signal, and making available to said integrated circuit only the first intermediate signal in the first operating condition and only the second intermediate signal in the second operating condition.

10. The method according to claim 9, wherein, in a third operating condition, said input signal is a third operating signal supplied by an inductive-signal source, the method further comprising the steps of:

in the third operating condition, receiving and amplifying said third operating signal, thus generating a third intermediate signal;

receiving, by the selector device, the third intermediate signal and making available to said integrated circuit only one from among the first intermediate signal, the second intermediate signal and the third intermediate signal in the respective first, second, and third operating conditions.

11. The method according to claim 10, further comprising the steps of:

supplying said first operating signal by a metal pad that forms, in use, a plate of a capacitor;

supplying said second operating signal by a metal pad that forms, in use, a plate which can be contacted ohmically; and supplying said third operating signal by an antenna that forms a first winding of a transformer, which is adapted to be coupled with a further external antenna that forms, in use, a second winding of said transformer.

12. The method according to claim 9, further comprising the steps of:
   generating an operating signal that assumes a first value in the first operating condition and a second value, different from the first value, in the second operating condition; and
   generating, by a comparator, on the basis of the operating signal and of a comparison signal, a control signal representing the first operating condition or the second operating condition.

13. The method according to claim 12, wherein said input stage includes a first input switch and a second input switch, which are complementary to one another and which have a respective control terminal that is configured to receive the input signal and to generate at output the operating signal, the communication cell further including a biasing circuit operatively coupled to the control terminal of the first and second input switches for supplying a biasing signal, the method further comprising the steps of:
   in the first operating condition, turning on, by the biasing signal, the first and second input switches, thus generating the first value of the operating signal;
   in the second operating condition, turning off, by the input signal, at least one between the first and second input switches thus generating the second value of the operating signal.

14. A circuit, comprising:
   a first input/output node configured to be coupled to a communications interface;
   an input node configured to be coupled to an output of an integrated circuit;
   an output node configured to be coupled to an input of the integrated circuit;
   a driving circuit coupled between the input node and the input/output node;
   a buffer circuit having an input coupled to the input/output node and an output;
   a capacitive communication receive circuit having an input coupled to the input/output node and an output;
   an inductive communication receive circuit having an input coupled to the input/output node and an output;
   a switching circuit having inputs coupled to the outputs of the capacitive and inductive communication receive circuits and having an output;
   a multiplexer having inputs coupled to the outputs of the switching circuit and the buffer circuit and having an output coupled to the output node;
   a first selection input configured to receive a first selection signal for controlling operation of the switching circuit to selectively coupled the output of the switching circuit to a selected one of the outputs of the capacitive and inductive communication receive circuits; and
   a second selection input configured to receive a second selection signal for controlling operation of the multiplexer to select between a signal at the output of the buffer circuit and a signal at the output of the switching circuit.

15. The circuit of claim 14, wherein the communications interface comprises an ohmic communications contact generating an ohmic signal applied to the input of the buffer circuit, and said second selection signal is configured to select the signal at the output of the buffer circuit.

16. The circuit of claim 14, wherein the communications interface comprises an antenna communications contact generating an inductive signal applied to the input of the inductive communication receive circuit, and said first selection signal is configured to control the switching circuit to couple the output of the inductive communications receive circuit to the input of the multiplexer and said second selection signal is configured to select the signal at the output of the switching circuit.

17. The circuit of claim 14, wherein the communications interface comprises a capacitive communications contact generating a capacitive inductive signal applied to the input of the capacitive communication receive circuit, and said first selection signal is configured to control the switching circuit to couple the output of the capacitive communications receive circuit to the input of the multiplexer and said second selection signal is configured to select the signal at the output of the switching circuit.

18. A communication cell, comprising:
   a physical interface coupled to a first input terminal of the communication cell and configured to supply to the first input terminal an input signal,
   wherein, in a first operating condition, said input signal is a first operating signal supplied by a capacitive-signal source and, in a second operating condition, said input signal is a second operating signal supplied by an ohmic-signal source; and
   a first receiver circuit including a buffer configured to form an interface for reception of said second operating signal and generation of a second intermediate signal correlated to said second operating signal;
   a second receiver circuit including a transimpedance-amplifier circuit operatively coupled to said capacitive-signal source and configured to receive and amplify said first operating signal to generate a first intermediate signal;
   an output stage configured to be coupled to said integrated circuit and including a selector device configured to receive the first intermediate signal and the second intermediate signal and to make available to said integrated circuit only the first intermediate signal in the first operating condition and only the second intermediate signal in the second operating condition;
   wherein, in a third operating condition, said input signal is a third operating signal supplied by an inductive-signal source, said communication cell further comprising:
   a third receiver circuit including a differential-amplifier circuit configured to be operatively coupled to said inductive-signal source to receive and amplify said third operating signal to generate a third intermediate signal,
   wherein said selector device is further configured to receive the third intermediate signal and to make available to said integrated circuit only one from among the first intermediate signal, the second intermediate signal, and the third intermediate signal during the respective first, second, and third operating conditions.

19. The communication cell according to claim 18, wherein said capacitive-signal source comprises a metal pad that forms, in use, a plate of a capacitor configured to generate the first operating signal; wherein said ohmic-signal source comprises a metal pad that forms, in use, a plate configured to be ohmically contacted for generating the second operating signal; and wherein said inductive-signal source comprises an antenna that forms a first winding of a transformer configured to be coupled with a further antenna external to said communication cell that forms a second winding of said transformer to generate, in use, said third operating signal.

20. A communication cell, comprising:
a physical interface coupled to a first input terminal of the communication cell and configured to supply to the first input terminal an input signal,
wherein, in a first operating condition, said input signal is a first operating signal supplied by a capacitive-signal source and, in a second operating condition, said input signal is a second operating signal supplied by an ohmic-signal source;
a first receiver circuit including a buffer configured to form an interface for reception of said second operating signal and generation of a second intermediate signal correlated to said second operating signal;
a second receiver circuit including a transimpedance-amplifier circuit operatively coupled to said capacitive-signal source and configured to receive and amplify said first operating signal to generate a first intermediate signal;
an output stage configured to be coupled to said integrated circuit and including a selector device configured to receive the first intermediate signal and the second intermediate signal and to make available to said integrated circuit only the first intermediate signal in the first operating condition and only the second intermediate signal in the second operating condition; and
a detection circuit configured to detect the first and second operating modes, including:
an input stage configured to generate an operating signal that has a first value in the first operating condition and a second value, different from the first value, in the second operating condition; and
a comparator configured to receive the operating signal and a comparison signal and to output a control signal representing one of the first operating condition or the second operating condition.

21. The communication cell according to claim 20, wherein said input stage includes the series of a first input switch and a second input switch which are complementary to one another and which have a respective control terminal adapted to receive the input signal,
the communication cell further including a biasing circuit operatively coupled to the control terminal of the first and second input switches for supplying a biasing signal,
the input signal and the biasing signal being competitive with one another in such a way that, in the first operating condition, both the first and second input switches are turned on by the biasing signal, thus generating the operating signal having the first value, and, in the second operating condition, at least one between the first and second input switches is turned off by the input signal thus generating the operating signal having the second value.

22. A communication cell, comprising:
a physical interface coupled to a first input terminal of the communication cell and configured to supply to the first input terminal an input signal,
wherein, in a first operating condition, said input signal is a first operating signal supplied by a capacitive-signal source and, in a second operating condition, said input signal is a second operating signal supplied by an ohmic-signal source; and
a first receiver circuit including a buffer configured to form an interface for reception of said second operating signal and generation of a second intermediate signal correlated to said second operating signal;
a second receiver circuit including a transimpedance-amplifier circuit operatively coupled to said capacitive-signal source and configured to receive and amplify said first operating signal to generate a first intermediate signal;
wherein the transimpedance-amplifier circuit comprises an operational amplifier having an inverting input coupled to the first input terminal for receiving the input signal, a non-inverting input biased to a reference voltage, and a feedback branch including a resistor which electrically couples an output terminal of the operational amplifier to the inverting input; and
the second receiver circuit further comprising a hysteresis threshold comparator configured to restore the logic levels of the signal supplied at output from the transimpedance amplifier and generate said first intermediate signal correlated to the first operating signal;
an output stage configured to be coupled to said integrated circuit and including a selector device configured to receive the first intermediate signal and the second intermediate signal and to make available to said integrated circuit only the first intermediate signal in the first operating condition and only the second intermediate signal in the second operating condition.

23. The communication cell according to claim 22, implemented as an integrated circuit device.

24. A communication method for an integrated circuit, comprising the steps of:
receiving, by a physical interface coupled to a first input terminal of the communication cell, an input signal, wherein, in a first operating condition, said input signal is a first operating signal supplied by a capacitive-signal source and, in a second operating condition, said input signal is a second operating signal supplied by an ohmic-signal source;
in the second operating condition, receiving by a buffer said second operating signal and generating a third intermediate signal correlated to said second operating signal,
in the first operating condition, receiving and amplifying, by a second receiver circuit including a transimpedance-amplifier circuit, said first operating signal, thus generating a first intermediate signal;
receiving, by a selector device, the first intermediate signal and the second intermediate signal, and making available to said integrated circuit only the first intermediate signal in the first operating condition and only the second intermediate signal in the second operating condition;
wherein, in a third operating condition, said input signal is a third operating signal supplied by an inductive-signal source;
in the third operating condition, receiving and amplifying said third operating signal, thus generating a third intermediate signal; and
receiving, by the selector device, the third intermediate signal and making available to said integrated circuit only one from among the first intermediate signal, the second intermediate signal and the third intermediate signal in the respective first, second, and third operating conditions.

25. The method according to claim 24, further comprising the steps of:
supplying said first operating signal by a metal pad that forms, in use, a plate of a capacitor;

supplying said second operating signal by a metal pad that forms, in use, a plate which can be contacted ohmically; and supplying said third operating signal by an antenna that forms a first winding of a transformer, which is adapted to be coupled with a further external antenna that forms, in use, a second winding of said transformer.

26. A communication method for an integrated circuit, comprising the steps of:

receiving, by a physical interface coupled to a first input terminal of the communication cell, an input signal, wherein, in a first operating condition, said input signal is a first operating signal supplied by a capacitive-signal source and, in a second operating condition, said input signal is a second operating signal supplied by an ohmic-signal source;

in the second operating condition, receiving by a buffer said second operating signal and generating a third intermediate signal correlated to said second operating signal, in the first operating condition, receiving and amplifying, by a second receiver circuit including a transimpedance-amplifier circuit, said first operating signal, thus generating a first intermediate signal;

receiving, by a selector device, the first intermediate signal and the second intermediate signal, and making available to said integrated circuit only the first intermediate signal in the first operating condition and only the second intermediate signal in the second operating condition;

generating an operating signal that assumes a first value in the first operating condition and a second value, different from the first value, in the second operating condition; and generating, by a comparator, on the basis of the operating signal and of a comparison signal, a control signal representing the first operating condition or the second operating condition.

\* \* \* \* \*